Sept. 5, 1972 J. P. MIZE 3,689,243

METHOD OF PASSIVATING SEMICONDUCTORS

Filed Dec. 8, 1969 2 Sheets-Sheet 1

INVENTOR

JACK P. MIZE

ATTORNEY

METHOD OF PASSIVATING SEMICONDUCTORS

Filed Dec. 8, 1969 2 Sheets-Sheet 2

INVENTOR
JACK P. MIZE

ATTORNEY

United States Patent Office 3,689,243

Patented Sept. 5, 1972

3,689,243

METHOD OF PASSIVATING SEMICONDUCTORS

Jack P. Mize, Richardson, Tex., assignor to Texas Instruments Incorporated, Dallas, Tex.

Filed Dec. 8, 1969, Ser. No. 883,020
Int. Cl. C03b 23/20
U.S. Cl. 65—42 8 Claims

ABSTRACT OF THE DISCLOSURE

A method of passivating semiconductors includes the step of contracting a quantity of passivating material into engagement with a semiconductor device. In a first embodiment, semiconductor devices are positioned in apertures formed in a glass plate. The glass plate is then heated and deformed into engagement with the devices to form passivated semiconductor units. In a second embodiment, semiconductor devices are initially surrounded by a quantity of powdered passivating material. Subsequently, the powdered material is melted and forced into engagement with the devices. In a third embodiment, a ring of passivating glass is positioned around a semiconductor device. Upon heating, the ring shrinks into engagement with the device.

Semiconductor devices, such as transistors, diodes, etc. are typically manufactured in the form of thin, flat structures including alternate layers of N-type and P-type semiconductor material. During the manufacture of such a device, it is necessary to form a seal across at least the intersections of the junctions between such layers with the surface of the device. Otherwise, the device is likely to become contaminated by moisture and thereby lose its desired electrical characteristics. Processes for providing such a seal are known in the art as "passivation" techniques.

In the past, most passivation techniques have employed hermetically sealed metal cans each enclosing an individual semiconductor device. More recently, the passivation of semiconductor devices by means of glass has become feasible. Typically, glass passivation techniques include the steps of coating the surface to be sealed with a slurry of glass and deionized water and heating to evaporate the water and fuse the glass.

This invention relates to a method of passivating semiconductor devices in which passivating material is contracted into engagement with a semiconductor device. In accordance with a preferred embodiment, semiconductor devices are positioned in apertures formed in a body of glass and the glass is deformed into engagement with the devices.

A more complete understanding of the invention may be had by referring to the following detailed description when taken in conjunction with the drawings, wherein.

Figure 1:
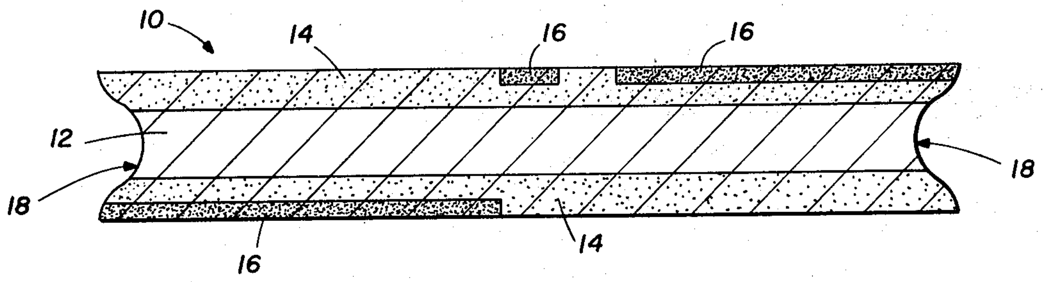
FIG. 1 is a sectional view of a semiconductor device.

Referring now to the drawings, and particularly to FIG. 1, there is shown a semiconductor device 10 of the type commonly referred to as a "Triac." The device 10 comprises an N-type silicon wafer 12 having regions of P-type silicon formed in it. The regions 14 in turn have regions of N-type silicon 16 formed in them. The regions 14 and 16 are preferably performed by doping the wafer 12 with suitable impurities in accordance with one of the diffusion techniques commonly employed in the semiconductor industry.

The semiconductor device shown in FIG. 1 differs from similar semiconductor devices in that it is provided with a notch-beveled edge surface 18. Such an edge surface is advantageous in high voltage semiconductor devices because it reduces the electric field across the junction between the P-type and the N-type regions at the surface of the device to below that in the bulk of the device. The surface 18 may be formed in any convenient manner, such as by coating the end surfaces of a semiconductor device with silicon nitride, sandblasting the edge surface of the device, etching the device, and then removing the silicon nitride coatings from the device.

Figure 2:
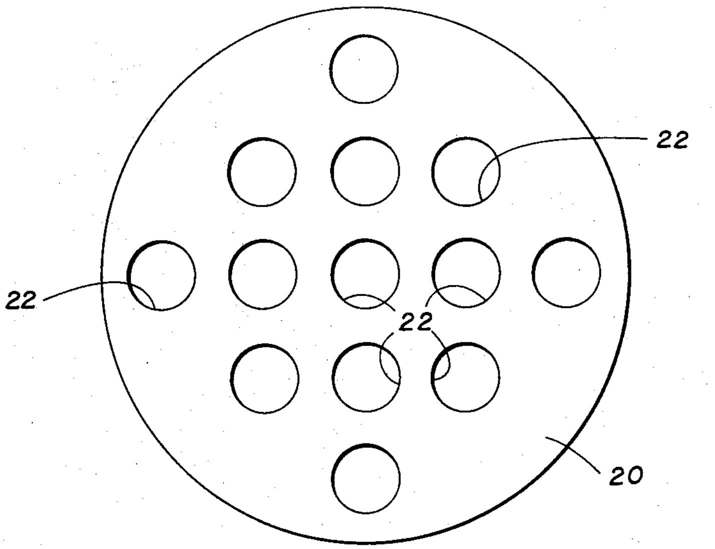
FIG. 2 is a top view of a passivation plate.

Referring now to FIG. 2, a semiconductor device passivation plate 20 is shown. The plate 20 is formed from a passivating material and has a plurality of semiconductor receiving holes 22 formed in it. Of course, the shape of the plate 20 and the arrangement of the holes 22 shown in FIG. 2 is exemplatory only in that a plate 20 of any desired shape and holes 22 arranged in any desired pattern can be employed in the practice of the invention.

Figure 3:
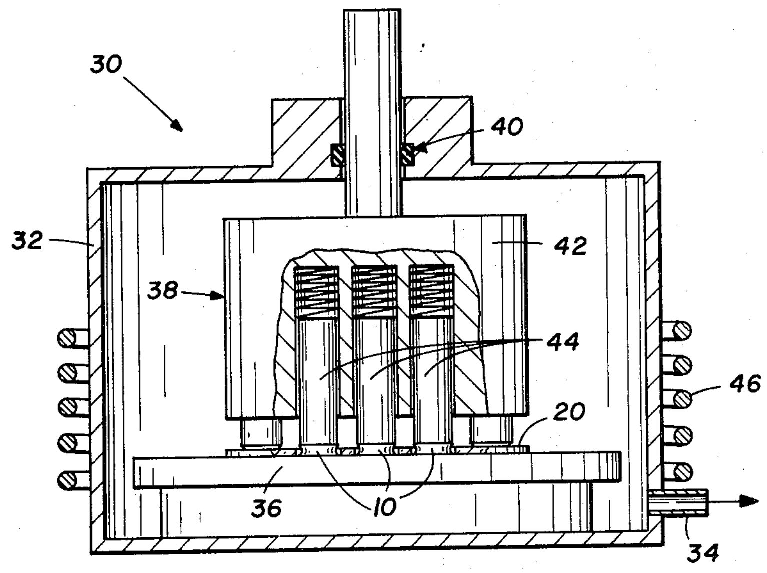
FIG. 3 is a schematic illustration of a passivation system useful in the practice of a first embodiment of the invention.

In accordance with the first embodiment of the invention, the passivation plate 20 shown in FIG. 2 is employed to passivate semiconductor devices of the type shown in FIG. 1 by means of a passivating system, such as the system 30 shown in FIG. 3. The passivating system 30 includes a chamber 32 that is entirely sealed except for a port 34 that leads to a vacuum pump. A graphite pedestal 36 is positioned within the chamber 32 and a passivating tool 38 extends into the chamber through a seal 40 formed in the upper end thereof. The tool 38 comprises a graphite tool body 42 having a plurality of spring loaded graphite fingers 44 extending downwardly from it. A heating coil 46 is positioned around a chamber 32 for use in controlling the temperature of the interior of the chamber.

Figure 4:
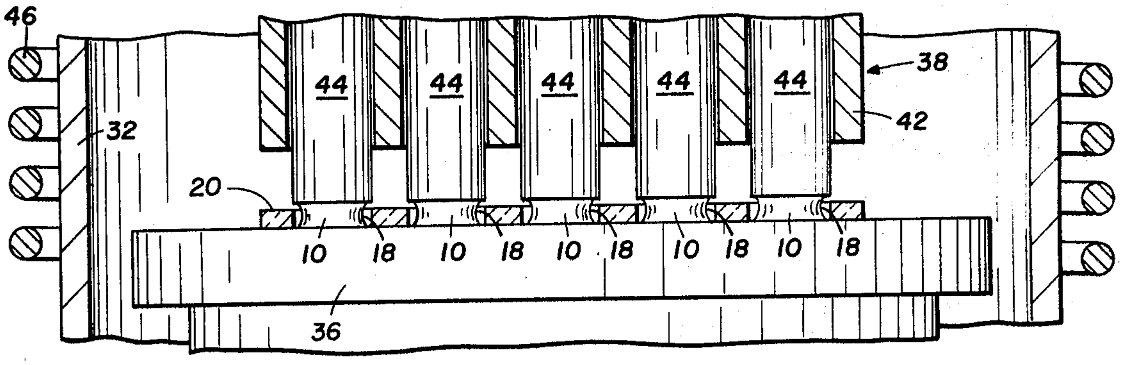
FIG. 4 is an illustration of an initial step in the first embodiment of the invention.
Figure 5:
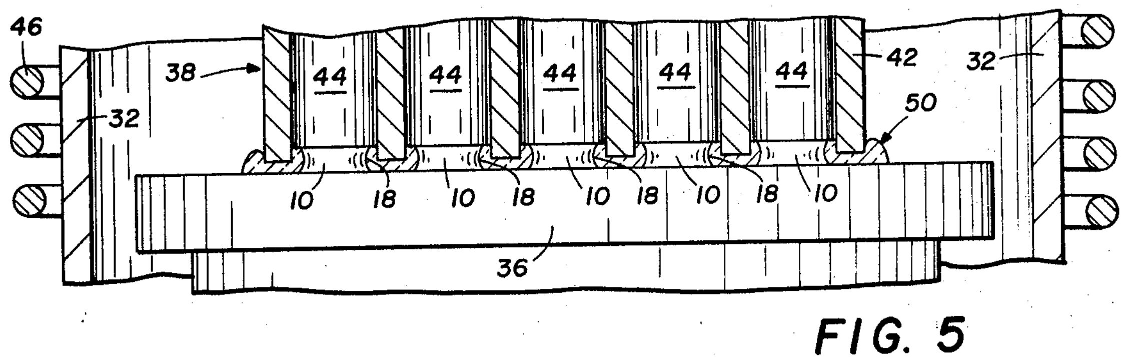
FIG. 5 is an illustration of a later step.

The use of the system 30 in passivating semiconductor devices of the type shown in FIG. 1 will be best understood by referring to FIGS. 4 and 5. Initially, a passivation plate 20 is positioned on the graphite pedestal 36 of the system 30. Then, a semiconductor device 10 is positioned within each hole 22 in the plate 20. During this operation, the devices 10 are very precisely aligned relative to each other.

After the semiconductor devices 10 have been aligned in the holes 22, the passivating tool 38 is lowered in the chamber 32 until the fingers 44 engage the devices 10. The fingers 44 are arranged in the same pattern as the holes 22 in the plate 20 and, accordingly, the fingers 44 engages the devices 10 on an individual basis. The function of the fingers 44 is to maintain the alignment of the devices 10 throughout the entire passivation process.

When the semiconductor devices 10 are suitably clamped between the fingers 44 and the pedestal 36, the interior of the chamber 32 is degassed. This is accomplished by operating the coil 46 to heat the interior of the chamber 32 to about 600° C. and simultaneously exhausting the interior of the chamber 32 through the port 34. When the degassing operation is complete, the coil 46 is operated to raise the temperature within the chamber 32 to about 1000° C. and to maintain that temperature until the material of the passivation plate 20 is softened.

When the material of the plate 20 is sufficiently fluid, the body 42 of the tool 38 is lowered into engagement with the plate 20. This deforms the passivating material comprising plate 20 into engagement with the edge surfaces 18 of the semiconductor devices 10 in the manner shown in FIG. 5. The temperature of the interior of the chamber 32 is then slowly reduced to room temperature. The product of the system 30 is an assembly 50 comprising a deformed plate 20 having a plurality of semiconductor devices 10 embedded in it.

During the entire operation of the system 30, the semiconductor devices 10 remain clamped between the fingers 44 and the pedestal 36. This prevents the material of the plate 20 from flowing into engagement with the end surfaces of the devices 10 and also maintains the alignment of the devices 10 relative to each other. Thus, the assembly 50 produced by the system 30 comprises accurately aligned semiconductor devices having exposed end surfaces.

When the assembly 50 as shown in FIG. 5 is suitably cool, the end surfaces of the devices 10 of the assembly are metalized in accordance with one of the commonly employed metalizing processes. The metal layers on the end surfaces of the devices 10 are then coated with one of the commercially available photo-resist compounds. Subsequently, the photo-resist compound is exposed to the light through a suitable mask and developed. At this point, certain portions of the metal layers on the end surfaces of the devices 10 are protected by the photo-resist compound while certain other portions are unprotected.

The assembly 50 is next exposed to an etching solution. The etching solution removes those portions of the metal layers that are not protected by the photo-resist compound. The remaining portions of the metal layers are then alloyed and heat treated. Finally, the assembly 50 is separated in discrete units each including one of the devices 10. This is preferably accomplished by one of the techniques commonly employed to separate individual semiconductor wafers from large slices, such as scribing and breaking.

Figure 6:
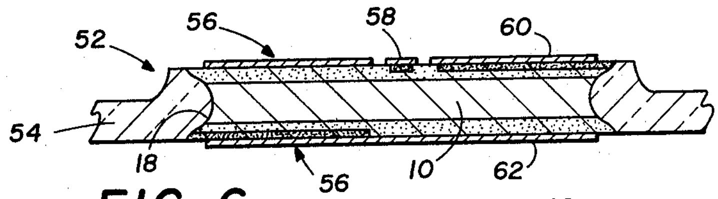
FIG. 6 is an illustration of a unit produced by the first embodiment.

The practice of the first embodiment of the invention results in semiconductor units such as the typical unit 52 illustrated in FIG. 6. The unit 52 comprises a semiconductor device 10 having a body of passivating material 54 secured to its edge surface 18 and having metal layers 56 secured to its end surfaces. The metal layers 56 comprise a gate 58 and a pair of terminals 60 and 62 for the device 10. Of course, the body of passivating material 54 originally comprised a portion of the passivation plate 20.

The semiconductor unit shown in FIG. 6 is very inexpensive to manufacture when compared with similar semiconductor devices. One reason for this result is that the unit 52 is complete and ready for use as shown. That is, no additional seals, leads, etc. are needed to complete the unit 52. Thus, the costs involved in mounting semiconductor devices in hermetically sealed cans and in providing electrical connections to such devices are eliminated when the present invention is used.

The unit illustrated in FIG. 6 is adapted for direct clamping engagement with heat sink structures. This eliminates the costly soldering or mechanical fastening operations usually involved in mounting semiconductor devices on heat sinks. Also, direct clamping engagement provides superior heat transfer characteristics, since both ends of the device may be placed in contact with a heat sink.

Another factor underlying the reduced costs involved in manufacturing the units 52 results from the use of passivation plates as carriers for semiconductor devices during the steps involved in metalizing the devices. Thus, a number of devices are passivated, metalized, coated with photo-resist, exposed, developed and etched simultaneously. This eliminates a number of the costly positioning steps that are necessary when semiconductor devices are positioned individually.

Figure 7:
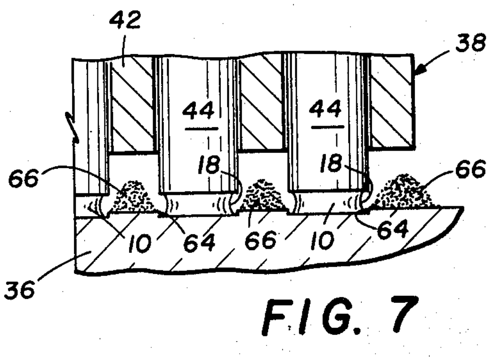
FIG. 7 is an illustration of a second embodiment of the invention.

A second embodiment of the invention is illustrated in FIG. 7. The second embodiment is similar to the first embodiment except that the semiconductor devices 10 are initially positioned and precisely aligned in a plurality of individual device receiving impressions 64 formed in the pedestal 36. Thereafter, the fingers 44 of the tool 38 are moved into engagement with the devices 10 to maintain the alignment of the devices throughout the passivating operation.

After the fingers 44 are engaged with devices 10, a quantity of powdered passivating material 66 is poured around each device. Then, the interior of the chamber 32 is degassed and the temperature within the chamber 32 is raised to a temperature above the melting point of the passivating material. When the passivating material has melted, the body 42 of the tool 38 is lowered into engagement with the passivating material. The passivating material is thereupon contracted into engagement with the edge surfaces 18 of the devices 10.

The embodiment of the invention shown in FIG. 7 produces an assembly similar to the assembly 50 produced by the first embodiment of the invention. The assembly is subsequently processed similarly to the assembly 50. The resulting semiconductor units are identical to the unit 52 shown in FIG. 6.

Figure 8:
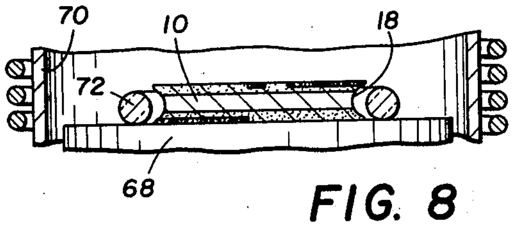
FIG. 8 is an illustration of a third embodiment of the invention.
Figure 9:
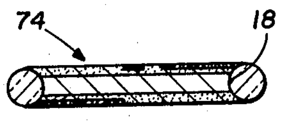
FIG. 9 is an illustration of a unit produced by the third embodiment.

Referring now to FIGS. 8 and 9, a third embodiment of the invention is shown. In accordance with the third embodiment, a semiconductor device 10 is positioned on a pedestal 68 within a chamber 70. A ring of passivating material 72 is then positioned around the device. Subsequently, the interior of the chamber 70 is degassed and raised to a temperature sufficient to soften the material of the ring 72.

As the ring 72 is heated, it contracts into engagement with the edge surface 18 of the device 10. Thereafter, the temperature within the chamber 70 is slowly reduced to room temperature. The third embodiment of the invention produces the unit 74 shown in FIG. 9 which comprises a semiconductor device having a body of passivating material secured to its edge surface. Subsequently, suitable leads are attached to the unit 74 in accordance with one of the techniques commonly employed in the manufacture of semiconductor devices.

The material employed as a passivating material in the various embodiments of the invention may be virtually any substance so long as certain basic requirements are observed. First, the passivating material must become fluid at a temperature below the temperature at which the impurity profiles in semiconductor materials begin to change, typically 1,300° C. Second, the passivating material must not contain a substance that diffuses into semiconductor materials and thereafter produces deleterious effects. Third, the passivating material must not contain highly mobile charge impurities, such as sodium ions. Fourth, the passivating material should have a coefficient of thermal expansion similar to that of semiconductor materials. Fifth, the passivating material should have a high dielectric strength.

One group of materials that may be employed in the practice of the invention are the borosilicate and aluminosilicate glasses. For example, either the borosilicate glass made by the Corning Glass Works and identified as Glass #7070 or the aluminosilicate glass made by the Corning Glass Works and identified as Glass #1715 may be used in the first and third embodiments of the invention. The powdered passivating material used in the second embodiment of the invention is preferably a mixture of either a borosilicate glass or an aluminosilicate glass and a ceramic such as mullite or cordierite.

Although specific embodiments of the invention are illustrated in the drawings and described herein, it will be understood that the invention is not limited to the embodiments disclosed but is capable of rearrangement, modification and substitution without departing from the spirit of the invention.

What is claimed is:

1. A method of passivating semiconductors comprising:
forming a plurality of apertures in a body of passivating material;
positioning a semiconductor device having notch-beveled peripheral edges in each of the apertures, and
interengaging the body of passivating material and said notch-beveled edges.

2. The method of passivating according to claim 1 wherein the body of passivating material is comprised of glass and wherein the interengaging step includes the step of softening the glass by applying heat thereto.

3. The method of passivating according to claim 1 wherein the positioning step includes the step of aligning the semiconductor devices relative to each other and wherein the interengaging step includes the step of maintaining the alignment of the semiconductor devices.

4. A method of passivating semiconductors including the step of:
forming a body of semiconductor material to have notch-beveled peripheral edges; and
deforming a body of passivating material into engagement with said notch-beveled edges.

5. The method of passivating semiconductors according to claim 4 wherein the body of passivating material is comprised of glass and wherein the deforming step is characterized by heating the glass.

6. A method of passivating semiconductors including the steps of:
forming said semiconductor to have a notch-beveled edge surface;
surrounding said semiconductor device with a quantity of powdered passivating material; and deforming the passivating material into engagement with said notch-beveled edge.

7. The method of passivating semiconductors according to claim 6 wherein the deforming step is carried out by melting the passivating material and forcing the melted material into engagement with said notch-beveled edge.

8. The method for passivating a semiconductor device comprising:
providing said semiconductor device with a notch-beveled peripheral edge surface;
forming an aperature through a layer of passivating material;
mounting said layer on a suitable support;
securing said semiconductor device within said aperture;
heating said passivating material to a relatively viscous state;
forming said viscous passivating material into contact with the peripheral edge of said semiconductor device; and
cooling said passivating material.

References Cited

UNITED STATES PATENTS

| | | | |
|---|---|---|---|
| 3,271,124 | 9/1966 | Clark | 65—54 |
| 2,340,879 | 2/1944 | Horn | 65—54 |

FOREIGN PATENTS

| | | |
|---|---|---|
| 145,894 | 3/1952 | Australia. |

ARTHUR D. KELLOGG, Primary Examiner

U.S. Cl. X.R.

65—44, 54